United States Patent [19]

Dey

[11] Patent Number: 4,571,533

[45] Date of Patent: Feb. 18, 1986

[54] STORAGE BATTERY CHARGING AND MONITORING APPARATUS

[76] Inventor: Ranjit Dey, 2465 Dunwin Dr., Unit 11, Mississauga, Ontario, Canada, L5L 1T1

[21] Appl. No.: 459,888

[22] Filed: Jan. 21, 1983

[51] Int. Cl.⁴ .............................................. H02J 7/10
[52] U.S. Cl. ...................................... 320/25; 320/39; 320/48; 320/59; 320/DIG. 2
[58] Field of Search ..................... 320/DIG. 2, 57, 59, 320/39, 40, 25, 26, 48

[56] References Cited

U.S. PATENT DOCUMENTS

| | | | |
|---|---|---|---|
| 3,204,193 | 8/1965 | Rhyne, Jr. | 320/DIG. 2 |
| 3,296,516 | 1/1967 | Paine, II et al. | 320/39 X |
| 3,553,561 | 1/1971 | Lesher | 320/39 X |
| 3,553,562 | 1/1971 | Woods | 320/39 |
| 3,617,851 | 11/1971 | DuPuy | 320/39 X |
| 3,696,286 | 10/1972 | Ule | 320/40 |
| 3,753,072 | 8/1973 | Jurgens | 320/39 |
| 3,997,831 | 12/1976 | Hopfner | 320/48 |
| 4,019,111 | 4/1977 | Bennefeld | 320/57 X |
| 4,027,231 | 5/1977 | Lohrmann | 320/48 X |
| 4,081,739 | 3/1978 | Gahler | 320/39 X |
| 4,217,533 | 8/1980 | Van Beek | 320/39 X |

Primary Examiner—R. J. Hickey
Attorney, Agent, or Firm—David W. Wong

[57] ABSTRACT

A battery charging apparatus automatically charges a storage battery to a predetermined voltage level in a rate proportional to the voltage condition of the battery. The charging apparatus is operative only when the battery is properly connected to its output terminals and a suitable alternating current source is present at its input. The apparatus also has means to signal improper reverse polarities connection to the storage battery. A monitoring device is provided in association with the charging apparatus, which is operative to provide a sequential light signal to indicate the voltage condition of the battery.

4 Claims, 2 Drawing Figures

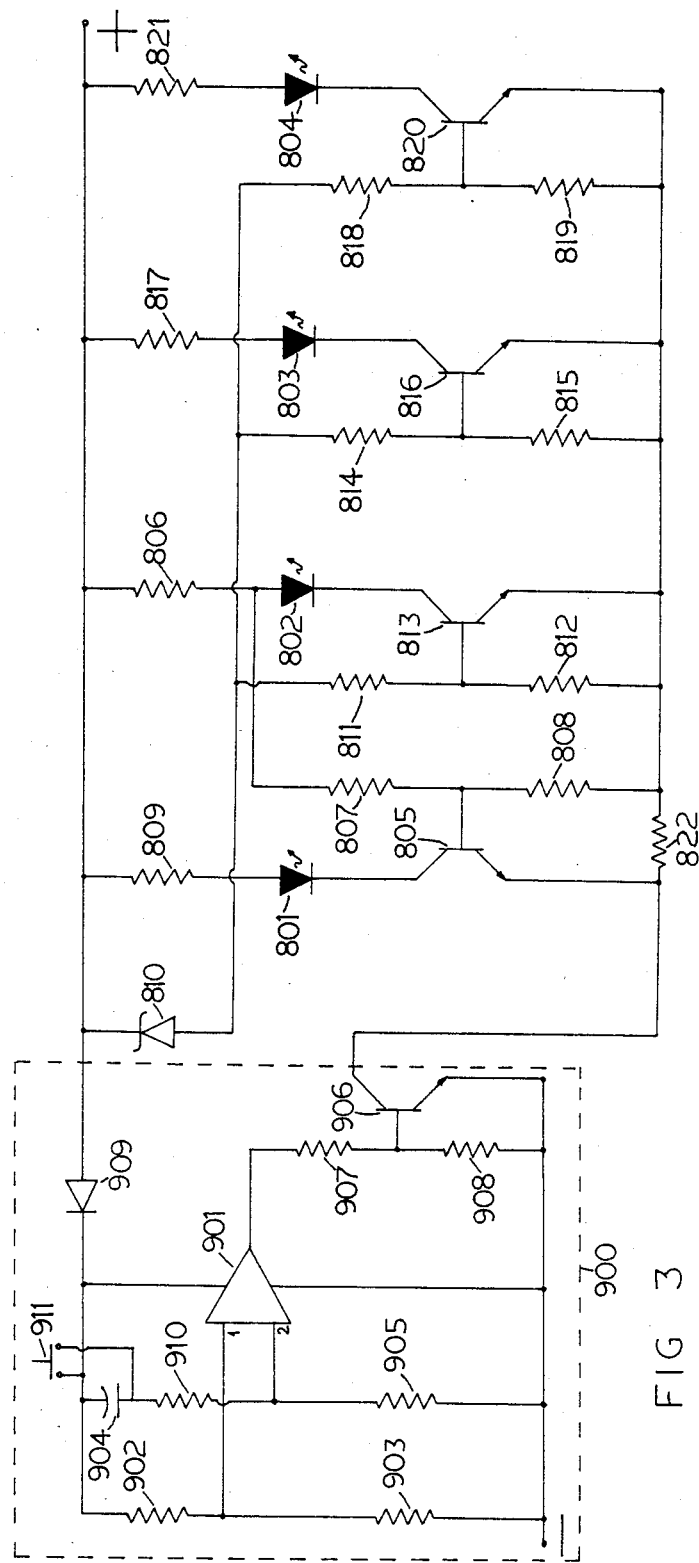

4,571,533

STORAGE BATTERY CHARGING AND MONITORING APPARATUS

BACKGROUND OF THE INVENTION

This invention relates to a charging and monitoring apparatus for storage type batteries such as lead-acid type batteries used in automobiles. It is known that such type of batteries deteriorate rapidly when they are continuously charged at a low charge rate or if they are overcharged. In order to provide proper charge to such storage batteries, the charge potential must be provided in a rate as fast as possible and tapering slowly to zero as the battery is becoming fully charged. Previously, the charging rate of battery chargers was either manually controlled or monitored by complex cyclical or electrical devices.

Furthermore, the increasing use of alternators in automobiles for providing electrical current to electrical accessories as well as maintaining the battery therein charged, presents a problem to battery charging apparatus that such alternator system normally includes diodes which can be easily damaged if the battery charger is connected in the reversed polarities to the alternator system. For this reason, when batteries are to be charged in situ on the vehicle it has been necessary to disconnect the battery cable connections in order to avoid damage to the alternator system.

Known battery charges also have been lacking in providing effective monitoring means to indicate the voltage condition of the battery.

OBJECT OF THE INVENTION

The primary object of this invention is to provide a battery charging apparatus which is simple in construction and operative to charge a battery automatically at a rate proportional to the condition of the battery. The rate is high when the battery voltage is low, and it becomes lower when the battery voltage increases until it is cut off when the battery voltage rises to a predetermined level.

It is a further object of the present invention to provide a monitoring apparatus in association with the charging apparatus for providing a sequential ligh signals to indicate the condition of the battery voltage level.

It is yet a further object of the present invention to provide a battery charging apparatus which is operative only if the battery connections are made in the correct polarities.

It is yet another object of the present invention to provide a battery charging apparatus which has a warning signal means operative to emit a warning signal if the battery connections are incorrectly made.

Another object of the present invention is to provide a battery charging apparatus suitable for charging common storage batteries as well as those referred to as maintenance-free storage batteries.

SUMMARY OF THE INVENTION

The above objects of the present invention ae provided by an automatic circuit which comprises a rectifying means having two silicon controlled rectifiers operative for converting an alternating current supply to the direct current required for charging the battery, and a control means comprises two transistor devices in response to the voltage level in the battery to be charged to actuate the silicon controlled rectifiers and to gauge the rate and amount of voltage to be delivered to the battery for charging the latter to a predetermined voltage level.

A monitoring means is also provided in association with the charging device to provide a visual sequential light signal to indicate the voltage condition of the battery.

A timer means may be provided with the monitoring means to connect it to the battery over a predetermined period of time to prevent an unnecessary drain on the battery current.

BRIEF DESCRIPTION OF THE DRAWINGS

Other objects of this invention will appear in the following description and appended claims, reference being made to the accompanying in which:

FIG. 2 is a circuit diagram of one embodiment of the monitoring means in association with the charging apparatus of the present invention.

FIG. 3 is a circuit diagram of one embodiment of a timer means in association with the monitoring means.

DESCRIPTION OF A SPECIFIC EMBODIMENT

Figure 1:
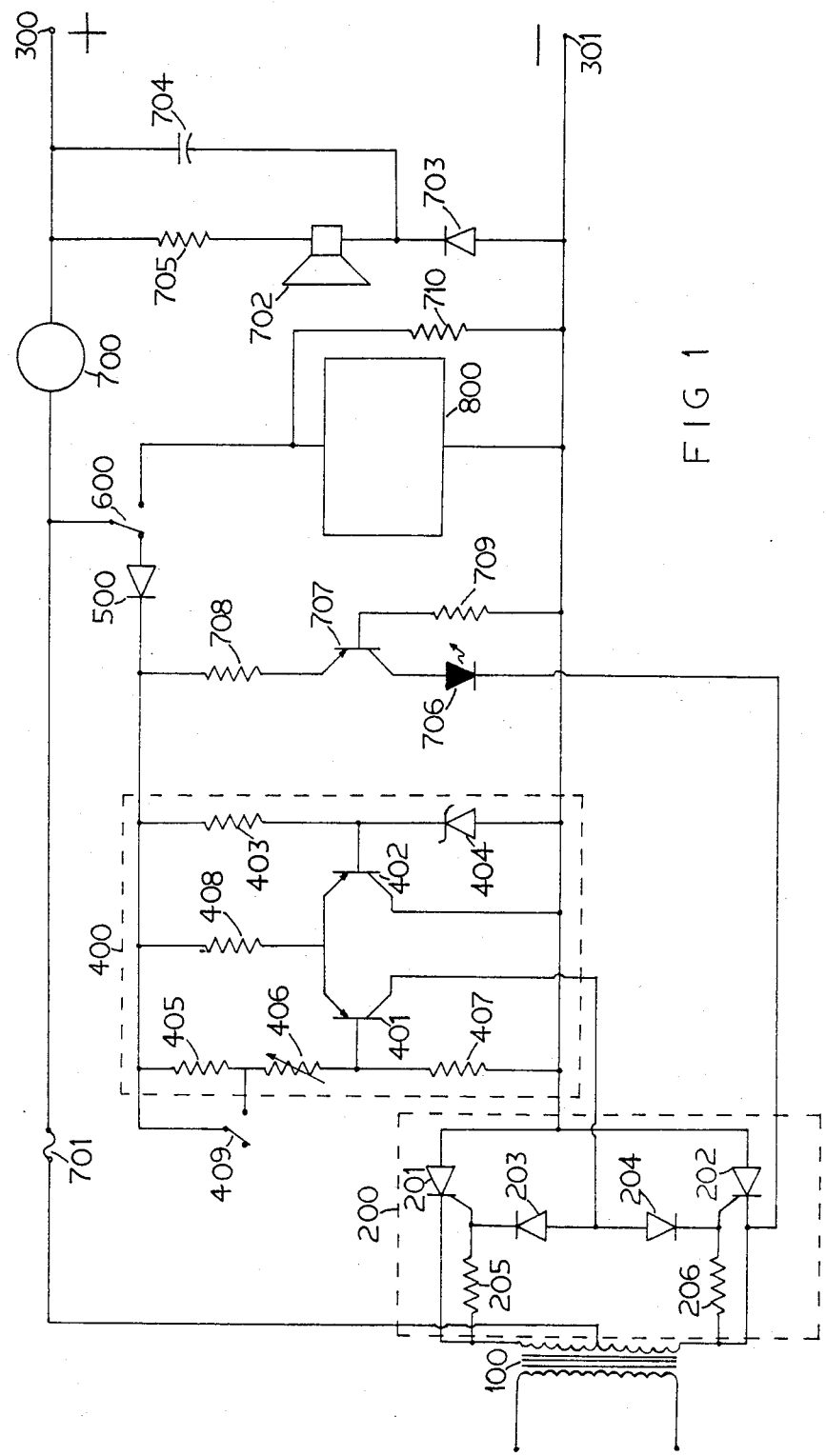
FIG. 1 is a circuit diagram of one embodiment of the charging apparatus according to to the present invention.

With reference to the drawings, the battery charger of the present invention includes a stepdown transformer 100 connected to a rectifier means 200. The stepdown transformer 100 reduces the common 120 volts alternating current to the lower voltage suitable for charging the storage battery. The rectifier means 200 includes silicon controlled rectifiers 201 and 202 and diodes 203 and 204 connecting respectively to each branch of the output of stepdown transformer 100. The silicon controlled rectifiers 201 and 202, when gated, act as a full wave rectifier means for supplying the charging current to the positive output connection terminal 300 and negative output connection terminal 301 for connection to the storage battery to be charged. The centre tap of the secondary output of the stepdown transformer 100 is connected to the positive output connection terminal 300. The gate terminals of the silicon controlled rectifiers 201 and 202 are connected to the respective output branches of the stepdown transformer 100 through series resistors 205 and 206 respectively.

The charging current is controlled by a control means 400 comprises transistors 401 and 402. The emitter of transistors 401 and 402 are commonly connected and, in turn, connected to the positive connection terminal 300 through resistor 408, diode 500 and selection switch 600. A resistor 403 and zener diode 404 are provided at the base of the transistor 402, while resistors 405, 406 and 407 provide a divider chain at the base of transistor 401. Resistor 406 is variable resistor adjustable to vary the amount of charging voltage required.

When the storage battery is connected to the positive and negative output connection terminals 300 and 301, current flows through resistor 403 and zener diode 404 to provide a reference voltage at the base of transistor 402. If the voltage of the storage battery is low the voltage at the base of transistor 401 is less than the reference voltage at the base of transistor 402, under such condition, transistor 401 is conductive to supply the gating signal from the battery to the gating terminals of the silicon controlled rectifiers 201 and 202, and the rectifier means 200 becomes operative to deliver the charging current to the battery in a high rate. As the voltage of the battery increases the voltage across resistor 407 increases accordingly until the voltage at the base of transistor 401 exceeds the reference voltage at the base of transistor 402. At this time, transistor 402 becomes conductive to cut off transistor 401, thereby removing the gating signal from the gating terminals of silicon controlled rectifiers 201 and 202 which then become non-conductive resulting in the termination of the charging current to the storage battery. The predetermined voltage level at which the charging operation is terminiated may be pre-set by the adjustment of resistor 406 in the tandem resistor 405 and 406 connected to the base of transistor 401. This voltage level is typically selected, for example, to be about 15.4 volts for charging the type of storage battery commonly known as maintenance-free battery used in a 12-volt electrical system in automobiles. For the general type of storage battery the fully charged level is typically set, for example, at about 14.4 volts. The tandem resistors 405 and 406 may be selected such that the required voltage level for the general type storage battery can be obtained by shorting out the resistor 405. A two-pole switch 409 may be provided for this purpose for conveniently and quickly setting the charging apparatus according to the present invention to these two voltage levels. It can be appreciated that as the reference voltage at the base of the transistor 401 is proportional to the voltage level in the storage battery, the control means inherently regulates the charging rate of the battery such that when the battery voltage level is low the charging rate is high, and the rate will decrease as the voltage level of the battery approaches the predetermined fully charged level.

An ammeter 700 is provided between output connection terminal and the transformer such as in the centre tap line of the transformer to indicate the charging current while the battery is being charged. Also, an overload protection means such as a fuse 701 may be provided in the same line to protect the apparatus in the event of unexpected circuit mulfunction.

In can further be appreciated by those skilled in the art that since the rectifier means 200 is activated only if a gating voltage is received by it from the control means 400 so as to provide the required charging current to the battery, the charging apparatus of the present invention operates only when the storage battery is connected to the connection output terminals 300 and 301 and the alternating current input voltage is present at the input of the rectifier means 200.

A sound signal means 702 such as an alarm horn is provided across the output connection terminals 300 and 301 with a series connected bias diode 703 such that a current will flow through the alarm horn to sound a warning signal when the battery polarities are connected accidentally in reverse to the output connection terminals 300 and 301. A capacitor 704 and resistor 705 provide a filter means to eliminate any voltage spikes that may be generated by the alarm horn thereby to prevent spurious triggering of the silicon controlled rectifiers 201 and 202 in the rectifier means 200. The diode 500 provides a reverse biassing means to protect the transistors in the control means 400 in case of accidental reverse battery polarities connection, since any reverse voltage will be blocked by this diode.

A light emitting diode 706, bias transistor 707, load resistor 708 and base resistor 709 are provided across the control means 400 and rectifier means 200. The light emitting diode 706 will be actuated to emit light only when both a negative voltage appear at the base of bias transistor 707 and an alternating current is present in the rectifier means. Since the bias voltage is provided by the storage battery and the alternating current is present only when the stepdown transformer is activated with an alternating current input, such inputs must both be present for the light emitting diode 706 to be lighted. In this manner, the lighting of the light emitting diode means 706 provides the visual indication that both these conditions have been fulfilled. Such provision is particularly useful when connections of the storage battery are being made in dimly lighted area or at night or when proper connection to the battery is not made due to corrsion or looseness of the battery terminals.

The condition of the storage battery may be monitored by a monitoring means 800. The selection switch 600 is operative to connect the battery to the control means 400 for the charging function or to connect the battery to the monitoring means 800 and the battery bleed resistor 710 for such monitoring purposes. The battery bleed resistor 710 is used to remove any voltage peak at the battery terminals by providing a consistent load for the battery. As shown in FIG. 2, the monitoring means according to the present invention comprises four light emitting diodes 801, 802, 803 and 804 to provide a sequential visual indication of the condition of the voltage level of the battery being tested. If the voltage in the storage battery is low, a current will flow to the base of bias transistor 805 through resistor 806, 807 and 808 to render bias transistor 805 conductive and as a result current will flow through resistor 809 to cause the light emitting diode 801 to be lighted to indicate a low voltage condition. When the voltage in the battery rises above a first predetermined level, the increased current will flow through zener diode 810, resistors 811 and 812 to render bias transformer 813 conductive resulting a current flow through resistor 806 to cause the light emitting diode 802 to emit light. The conduction of bias transistor 813 in turn causes the removal of the voltage at the base of bias transistor 805 to render it non-conductive, and, as a result, light emitting diode 801 will be turned off when the light emitting diode 802 is turned on. As the voltage of the storage battery rises further to a second predetermined level, the increased current will flow through zener diode 810 to resistors 814 and 815 to render bias transistor 816 conductive, and current will then also flow through resistor 817 to turn on light emitting diode 803 in addition to light emitting diode 802. When the voltage level of the battery rises still further to a third predetermined level, the further increased current will also flow from zener diode 810 through resistors 818 and 819 to render bias transistor 820 conductive, and current will flow through resistor 821 to turn on light emitting diode 804 in addition to light emitting diodes 802 and 803. In the same manner, when the voltage level in the battery rises yet about a fourth predetermined level, the still further increased current flowing through resistor 822 will provide the voltage at the base of bias transistor 805 to render it conductive and current will flow through resistor 809 to turn on light emitting diode 801 again in addition to light emitting diodes 802, 803 and 804. In the above sequence the four light emitting diodes 801 through 804 provide a sequential light bargraph indication of the condition of the voltage in the storage battery. Typically, the light emitting diode 801 representing light bar number 1 in the bargraph is set to turn on when the battery voltage is less than 11.5 volts; the first predetermined level at which light emitting diode 802 representing light bar number 2 in the bargraph is set to turn on at about 12.5 volts. The second predetermined level at which both light emitting diodes 802 and 803 are turned on is set to indicate a charged battery at about 14.4 volts. The third predetermined level at which light emitting diodes 802, 803 and 804 representing light bars numbers 2, 3 and 4 are turned on is set at about 15.4 volts to indicate that the internal charging circuit of the automobile is operating satisfactory with the engine running, and the fourth predetermined level at which all the light bars one through four inclusive are turned on is set at about 16 volts to indicate the overvoltage condition in the charging system of the automobile.

It can be appreciated that the monitor means may be built either integral to the charging apparatus or as a separate unit that can be connected to the charging unit or directly to the battery circuit in the automobile to provide a constant monitoring means of the voltage condition of the battery. When such monitoring means is connected permanently to the battery circuit in the automobile a timer means 900 as shown in FIG. 3 may be incorporated to connect it to the battery for a predetermined period of time so as not to present unnecessary drain on the battery current. The timer means 900 comprises a logic control means 901 which is conductive when the voltage at its input terminal 1 is negative with respect to that at its input terminal 2, and it will become non-conductive when the voltage at its input terminal 2 is negative with respect to that at its input terminal 1. Timing is accomplished by feeding a fixed potential to the input terminal 1 of the logic control means 901 via the potential divider resistors 902 and 903, while the input to the input terminal 2 of the logic control means is fed with a decreasing voltage dependent on the time constant of the combination of capacitor 904 and resistor 905. After a predetermined time, the voltage at input terminal 2 swings negative with respect to the voltage at input terminal 1; at this time the logic control means 901 becomes non-conductive to terminate the voltage at the base of transistor 906, since there is no current flowing through resistors 907 and 908. As a result, the connection of the monitoring means to the negative terminal of the battery is cut off. A diode 909 can be provided to protect the logic control means in case of idadvertent reverse polarities battery connection. A resistor 910 ensures that the voltage at the input terminal 2 of the logic control means 901 does not transiently exceed the rated voltage of the logic control means 901. The timer means 900 may be selectively operated and reset by closing the momentary switch 911 which effectively discharges the capacitor 904 to reset the predetermined time constant.

Common cables with clip-on type connectors may be provided at the output connection terminals of the charging and/or monitoring apparatus according to the present invention for connection to the battery. Alternatively, a connector for direct plug-in to the cigarette lighter socket in the automobile may be provided on the connection cables for effecting connection to the battery circuit in the automobile.

While the invention has been particularly shown and described with reference to preferred embodiments thereof, it will be understood by those skilled in the art that various changes in form and detail may be made therein without departing from the spirit and scope of the invention. For example, more than four light emitting diodes may be incorporated in the monitoring means to provide a more gradual and frequent sequential light indication of the voltage levels of the storage battery or incandescent lamps may be used instead of the light emitting diodes. Also, suitable components may be used to provide charging and monitoring functions for batteries of other voltages such as the common 6-volt storage battery. "Also, the indicator lights sequence may be re-arranged in any selected fashion to denote various charging and battery conditions".

What I claim as my invention is:

1. A battery charging apparatus having a first output terminal and a second output terminal, for charging a storage battery having a positive electrode operatively connected to said first output terminal and a negative electrode operatively connected to said second output terminal, comprising a stepdown transformer means operative to provide an alternating current of a selected level, said stepdown transformer means having a secondary winding with a centre tap connected to said first output terminal, silicon controlled rectifier means coupled to said transformer means having an output terminal connected to said second output terminal, said rectifier means being operative selectively to provide and to terminate a direct current for charging said storage battery, control means comprising two transistor means each having base, emitter and controller electrodes wherein the emitter electrodes are commonly connected to said first output terminal, one transistor means having resistor means connected to the base electrode therein and responsive to current flowing through said resistor means to establish a reference voltage, the second transistor means having adjustable resistor means connected to the base electrode therein, said adjustable resistor means being operative to establish a selected charging voltage level, said second transistor means being responsive to comparison of said selected charging voltage level to said reference voltage to selectively activate and deactive said silicon controlled rectifier means for charging said storage battery with said direct current.

a diode means having a cathode terminal and an anode terminal, a resistor means connected to said cathode terminal of said diode means and said commonly connected emitter electrodes of said two transistor means, and said anode terminal of said diode means being connected to said first output terminal, a second resistor means connected in series to said adjustable resistor means, a switch connected in parallel to said second resistor means and operative to short circuit said second resistor means to provide a second selected voltage level for charging said storage battery, a second diode means and a third diode means each having a cathode terminal and an anode terminal, the anode terminals of said second diode means and third diode means being commonly connected together, said silicon controlled rectifier means having a first silicon controlled rectifier and a second silicon controlled rectifier both having an anode terminal connected commonly to said second output terminal, said first silicon controlled rectifier having a cathode terminal connected to one terminal of said secondary winding of said transformer means and a gating terminal connected to said cathode terminal of said second diode means, said second silicon controlled rectifier having a cathode terminal connected to a second terminal of said secondary winding of said transformer means, and a gating terminal connected to said cathode terminal of said third diode means, a first resistive means connected between said gating terminal of said first silicon controlled rectifier and said first terminal of said transformer means, a second resistive means connected between said gating terminal of said second silicon controlled rectifier and said second terminal of said transformer means, a light emitting means having a cathode terminal connected to said cathode terminal of said second silicon controlled rectifier, a third transistor means having a collector electrode, emitter electrode and a base electrode, said anode terminal of said light emitting means being connected to said collector electrode of said third transistor means, a second resistive means having one terminal connected to said emitter electrode of said third transistor means and a second terminal connected to said second output terminal, a third resistive means having one terminal connected to said base electrode of said third transistor means and a second terminal connected to said second output terminal.

2. A battery charging apparatus according to claim 1 including a fourth diode means having an cathode terminal and an anode terminal, siad cathode terminal being connected to said second output terminal, a sound signal generating means having a first input terminal and second input terminal, said anode terminal of said fourth diode means being connected to said first terminal of said sound signal generating means, a fourth resistive means connected to said second input terminal of said fourth diode means and also connected to said first output terminal, a capacitor means connected between said anode terminal of said fourth diode means and said first output terminal.

3. A battery charging apparatus according to claim 2 including a monitoring means operative to connect to said storage battery to provide sequential light indications of said instant voltage level of said battery.

4. A voltage monitoring apparatus for a storage battery, comprising first terminal means and second terminal means operative for connecting to the positive and negative electrodes respectively of said battery, a transistor means having a base electrode, emitter electrode and collector electrode, said emitter electrode being connected to said second terminal means, said collector electrode being connected to a cathode terminal of a light emitting diode, said light emitting diode having an anode electrode connected to a series resistor and said series resistor being connected to said first terminal means, a first resistor means having one terminal and a second terminal, a second resistor means having one terminal and a second terminal, a third resistor means having one terminal and a second terminal, a fourth resistor means having one terminal and a second terminal, said one terminal of said first resistor means being connected to said emitter electrode of said transistor means, and said second terminal of said first resistor means being connected to said one terminal of said second resistor means, said second terminal of said second resistor means being connected to said base electrode of said transistor means, said one terminal of said third resistor means being connected to said base electrode of said transistor means, said second terminal of said third resistor means being connected to said one terminal of said fourth resistor means, said second terminal of said fourth resistor means being connected to said first terminal means, at least one light indication means connected between said first terminal means and second terminal means, said light indication means comprising a switching transistor means having a base electrode, emitter electrode and collector electrode wherein said emitter electrode is connected to said second terminal of said first resistor means, said base electrode is connected to a series resistor, and said series resistor being connected to said second terminal of said first resistor means, said base electrode is also connected to a second series resistor, and said second series resistor being connected in series to a zener diode means, and said zener diode means being connected to said first terminal means, a light emitting diode having a anode terminal and a cathode terminal, said collector electrode of said switching transistor means being connected to said cathode terminal of said light emitting diode and said cathode terminal of said light emitting diode and said anode terminal of said light emitting diode being connected to said one terminal of said fourth resistor means.

* * * * *